United States Patent [19]

Bingham

[11] Patent Number: 4,458,216

[45] Date of Patent: Jul. 3, 1984

[54] SWITCHED-CAPACITOR MODULATOR FOR QUADRATURE MODULATION

[75] Inventor: John A. C. Bingham, Palo Alto, Calif.

[73] Assignee: Racal-Vadic, Inc., Milpitas, Calif.

[21] Appl. No.: 304,690

[22] Filed: Sep. 22, 1981

[51] Int. Cl.³ .......................... H03C 1/02; H03K 7/00
[52] U.S. Cl. ................................. 332/9 R; 332/31 R; 332/37 R
[58] Field of Search ...................... 332/9 R, 9 T, 31 R, 332/31 T, 37 R, 10, 40, 41, 42, 44, 45, 46, 48, 52; 455/108, 109; 375/41, 43, 61

[56] References Cited

U.S. PATENT DOCUMENTS

| | | | |
|---|---|---|---|
| 3,937,882 | 2/1976 | Bingham | 375/10 X |
| 4,295,105 | 10/1981 | Bingham | 332/9 R |

OTHER PUBLICATIONS

"An Overview of Switched-Capacitor Networks", Martin, Asilomar Conference on Circuits, Systems & Computers, Nov. 1980.
"Generation of Synchronous Data Transmission Signals by Digital Echo Modulation," M. F. Choquet and H. J. Nussbaumer, IBM J. on Res. Dev., Sep. 1971.
"Improved Circuits for the Realization of Switched Capacitor Filters", Ken Martin, Proceedings of 1979 ISCAS.
"The Digital Echo Modulation", Croisier and Pierret, IEEE Transactions on Communication Technology, vol. Com-18, No. 4, Aug. 1970.
Hosticka, B. J. et al., "MOS Sampled Data Recursive Filters Using Switched Capacitor Integrators", IEEE Journal of Solid State Circuits, vol. SC12, No. 6, pp. 600-608, Dec. 1977.
Martin, K. et al., "Strays Insensitive Switched-Capacitor Filters Based on Bilinear Z Transform", Electronics Letters, vol. 15, No. 3, pp. 365-366, Jun. 1979.
Richardson, A. J., "Balanced Modulator Using CMOS Switches", Electronic Engineering, Dec. 1978, p. 17.

*Primary Examiner*—Stanley D. Miller
*Assistant Examiner*—W. R. Paxman
*Attorney, Agent, or Firm*—Arnold, White & Durkee

[57] ABSTRACT

A switched-capacitor modulator for quadrature modulation is disclosed. The modulator of the present invention provides a means for simultaneous modulation of two carrier signals in quadrature by two input signals in such a way that the gains of the two modulations are exactly the same. In accordance with the invention a switched-capacitor modulator is provided having a plurality of input signal sources for quadrature amplitude modulation. The invention provides for a single common switched-capacitor network with multiple switches or multiple switched-capacitor networks for each incoming modulating signal. A switched-capacitor network utilized to form and modulate a carrier signal for shaping the carrier to reduce sidebands of the third and fifth harmonics in the modulated signal is also disclosed.

10 Claims, 6 Drawing Figures

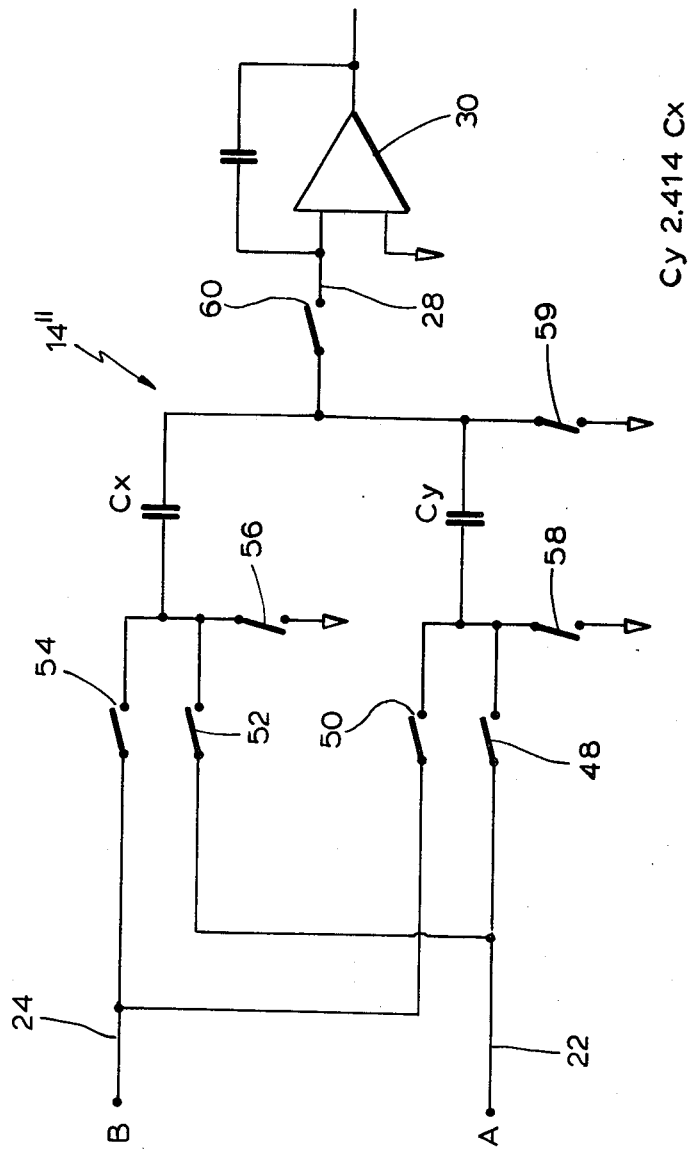

SWITCHED-CAPACITOR MODULATOR FOR QUADRATURE MODULATION

BACKGROUND

The present invention relates generally to switched-capacitor modulators and more specifically to switched capacitor modulators utilized in systems employing quadrature modulation.

Modulators have been implemented by previous designs using various types of nonlinear devices such as vacuum tubes, diodes, transistors and switches in combination with either transformers or amplifiers. A modulator of this type has been disclosed in U.S. Pat. No. 3,937,882 (Bingham) issued Feb. 10, 1976. In this type of device, if the application criteria require all spurious outputs of the modulator to be suppressed to a low level, individual adjustment of circuit parameters is necessary.

It is very desirable to have electronic network transfer functions realized in designs using only those components which can be fabricated using large scale integration techniques. One set of such components comprises switches, capacitors and operational amplifiers. The technology for using these components has become known as the switched-capacitor technology and has been described in many publications including Hosticka et al., IEEE Journal of Solid State Circuits, December, 1977, page 600.

In that publication a second order switched-capacitor filter utilizing positive and negative integrator units is disclosed.

In the development of this technology it has been noted that the transfer functions of switched-capacitor circuits are sensitive to stray capacitances from each plate of the capacitor to the substrate which is equivalent to signal ground. The larger of these stray capacitances, otherwise known as parasitic capacitances, occurs between the bottom plate of the capacitor and the substrate. This capacitance can generally be rendered harmless by configuring the circuit so that the bottom plate of the capacitor is connected to ground. This configuration will still exhibit circuit sensitivity to the smaller of the parasitic capacitances occurring between the top plate of the capacitor and the grounded substrate.

Two implementations of switched-capacitor integrators, which are completely insensitive to parasitic capacitances, are described by Martin and Sedra in Electronics Letters, June 21, 1979, page 365. A complementary pair of inverting and noninverting integrators is disclosed by Martin and Sedra as well as circuit implementations for various filter sections.

In co-pending application, Ser. No. 119,374, filed Feb. 7, 1980 in the name of the inventor of the present invention, now U.S. Pat. No. 4,295,105, switched-capacitor modulator is disclosed wherein a modulating signal is applied to an integrator which is alternately operated in the inverting and noninverting mode under the control of a carrier signal.

In systems employing quadrature modulation it is necessary to effect the simultaneous modulation of two carrier signals which are at the same frequency but separated in phase by ninety degrees.

In some applications of a switched-capacitor modulator in an amplitude modulation communication system it is desirable to use a shaped carrier signal to suppress third and fifth harmonics of the carrier. In using a shaped carrier in a switched-capacitor modulator, two capacitors are needed and a problem of balancing exists.

SUMMARY OF THE INVENTION

The present invention enables the simultaneous modulation of two carrier signals in quadrature by two input signals in such a way that the gains of the two modulations are exactly the same. This may be useful in systems employing quadrature amplitude modulation where the balance of the two channels is critical; one example would be a system for generating a single sideband.

In accordance with the present invention a switched-capacitor modulator is provided having a plurality of input signal sources for quadrature amplitude modulation of the system carrier signals. In a primary embodiment of the invention the switched-capacitor modulator includes a network having a plurality of switches electrically associated with a common capacitance. A logic circuit is provided for the network, adapted to receive a plurality of carrier signals for controlling the switches. The carrier signals are all at the same frequency but may be out of phase with respect to one another. A clocking signal is also provided to the logic circuit.

Operationally, the switched-capacitor circuit modulates each of the carrier signals with signals from each of the input signal sources. This modulation is accomplished by sequential connection of the input signals to the common capacitance through a combination of closures of the plurality of switches. This operation may be performed in both the inverting and noninverting mode of the switched-capacitor network. Thus the carrier signals are modulated and delivered to a current sink integrator which delivers the modulated system signal.

In one embodiment of the invention two signal sources are connected to a common capacitor by way of individual electrical switches. The common capacitor is provided with two additional switches between the plates of the capacitor and ground. Finally, a switch is provided between the common capacitance and the following integrator circuit.

In accordance with the present invention, an integrator is changed between the inverting and noninverting modes under the control of a plurality of carrier signals for an amplitude modulation system. A plurality of incoming or modulating signals are applied to the switched-capacitor integrator network. The connection of the modulating signal to the common capacitance in one embodiment of the invention is controlled by a logic circuit and the state of each of the plurality of carrier signals. The components used in the circuit design of the switched-capacitor network are fully suitable for implementation into a large scale integrated circuits.

In an alternative embodiment of the present invention multiple switched-capacitor networks may be utilized for each incoming modulating signal. Each network having its own capacitance and sharing an electrical switch to the remainder of the system. In this latter embodiment it is important to balance the capacitances in the system so as to ensure that there is minimized degradation in the overall system gain.

In still a further alternative embodiment of the present invention a switch capacitor network may be utilized to formulate and modulate a carrier signal for shaping the carrier to reduce side-bands of the third and fifth harmonics in the modulated signal. In such a switched-capacitor network, two capacitors are used having the relationship where one capacitance is 2.414 times the other. The electrical switching network in this switched-capacitor modulator receives a plurality of input signals that are alternately fed to each of the capacitors through electrical switches controlled by the sign of the carrier signals. This in effect shapes the carrier signals and provides signal values of 1, 2.414, −1 and −2.414 for example, thus reducing any third and fifth order harmonics in the original carrier signals.

The present invention provides for a switched-capacitor modulator in a quadrature amplitude modulation communication system wherein the carrier signals are out of phase with respect to one another and there are two distinct input signal sources which are to modulate the carrier signals.

A principal advantage of the present invention for use in amplitude modulation systems is the ability to share a single capacitor for standard carrier signals and to share multiple capacitors for shaped carriers, alleviating the problem of balancing the capacitance of the circuit while reducing gain problems in the system. This feature in the present modulator is accomplished by adding an electrical switch between the input signal sources and the common capacitance and controlling the input signals by the state of the carrier signals.

BRIEF DESCRIPTION OF THE DRAWINGS

Other features and advantages of the present invention will become apparent from the detailed description when taken in conjunction with the drawings where like elements are given identical reference numerals in which.

DETAILED DESCRIPTION

Figure 1:
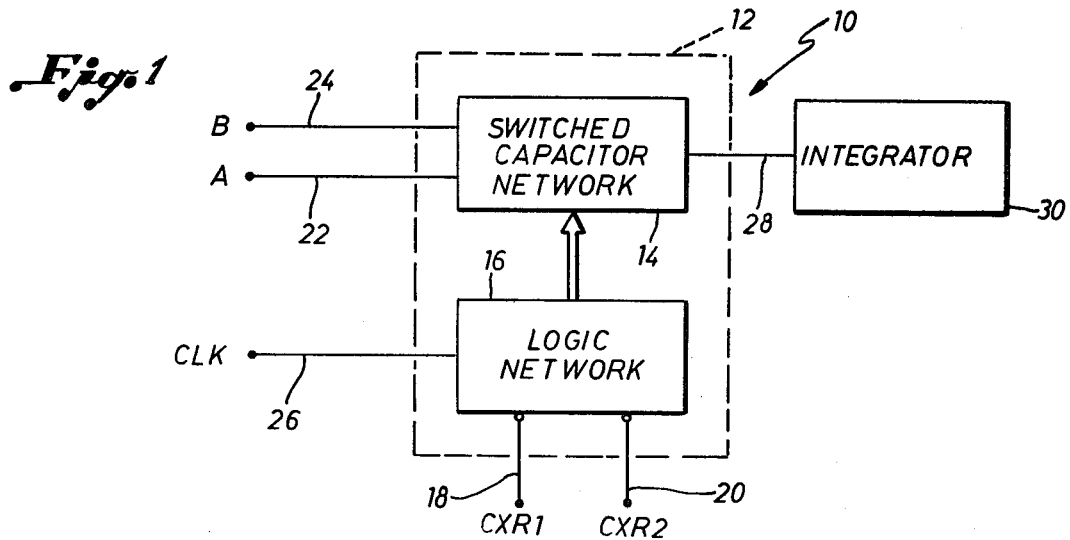
FIG. 1 is a schematic block diagram illustrating a switched capacitor network for an amplitude modulation system in accordance with the present invention.

Referring now to the figures and specifically to FIG. 1, a block diagram illustrating a modulating system 10 for a multi-carrier communication system is shown. A switched-capacitor modulator 12 is provided to include a switched-capacitor circuit 14 and a logic network 16.

In multiple carrier signal communication systems, multiple inlet signals are required to modulate the respective number of carriers in the system. In system 10 two carriers are illustrated CXR1, 18, and CXR2, 20, which are modulated by input signals 22 and 24.

A clock signal 26 is applied to the logic network 12 to provide a means of sampling the modulating signals 22 and 24 which are applied to the switched-capacitor network 14. The carrier signals 18 and 20 are applied to the logic network 16 with the state of each carrier signal determining whether the sampled modulating signals 22 or 24 is applied to the switched-capacitor network 14. The network 14 generates an output modulated signal 28 which may be delivered to an integrator circuit 30. The integrator 30 in the preferred form is an inverting amplifier with a feedback capacitor.

In the multiple carrier communication system 10, illustrated in FIG. 1, the carriers 18 and 20 are out of phase with respect to one another while having the same frequency. This is further illustrated in the timing diagram of FIG. 3. The modulating input signals 22 and 24 may be independent, as in a quadrature amplitude modulation system, or they may be 90° out of phase with respect to one another, as in a single-sideband modulation system.

Figure 2:
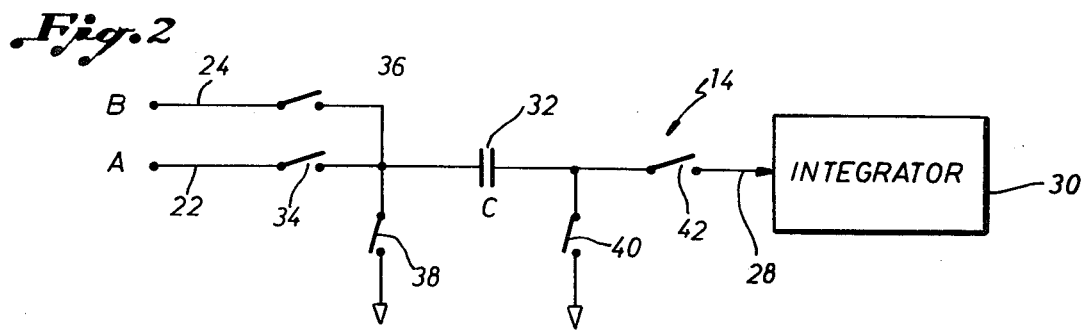
FIG. 2 is a circuit diagram of a switched-capacitor modulator for use in a quadrature amplitude modulation system in accordance with the present invention.

In a first embodiment of the present invention shown in FIG. 2, multiple input signals 22 and 24 are selectively connected to a common capacitance 32 as a function of the state of the carrier signals 18 and 20.

Figure 3:
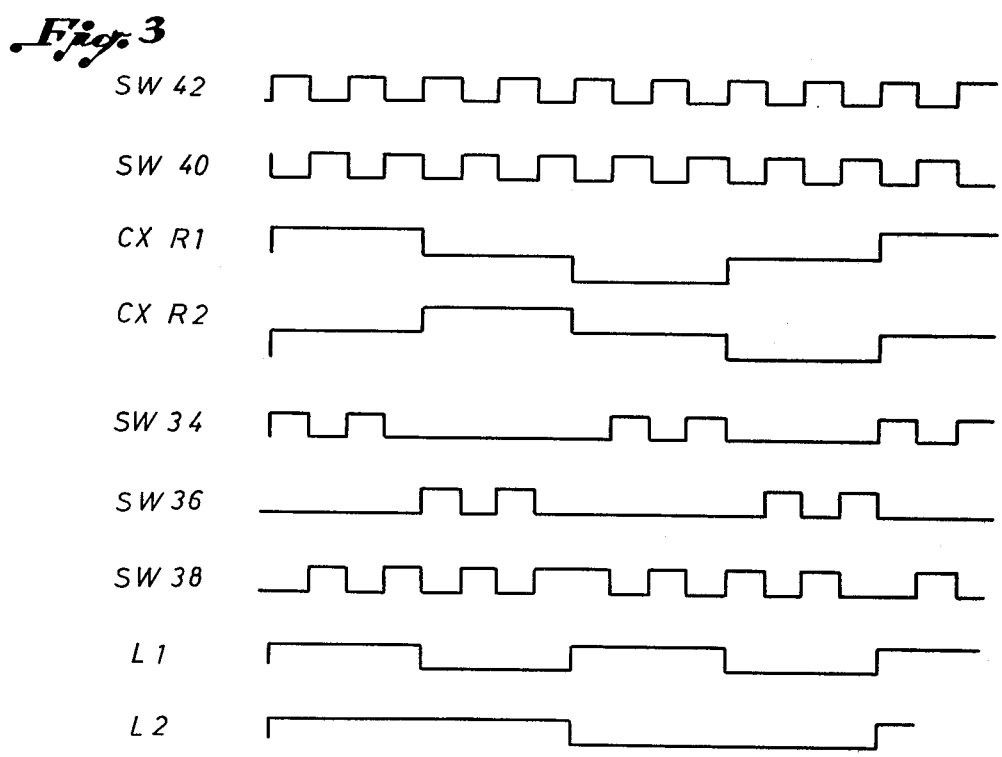
FIG. 3 is a timing diagram of the logic of one embodiment to activate the switches of FIG. 2.

As shown in the timing diagrams of FIG. 3 (for the particular case in which the frequency of the switching signal for the capacitor network is eight (8) times the carrier frequency) the carrier signals 18 and 20 may have values of 0, +1 and 31 1. Since the carriers 18 and 20 are out of phase with respect to one another, the logic circuit 16 as pulsed by the sampling clock signal 26 demonstrated in FIG. 1, will cause the switches 34, 36, 38, 40 and 42 to selectively open and close. This operation will electrically connect either of the input signals 22 or 24 to charge the common capacitance 32 to generate a modulated signal 28.

As shown in the timing diagram of FIG. 3, during a selected first quarter time period of the carrier signals 18 and 20 the switch 38 is closed simultaneously with the switch 40 thereby discharging the common capacitance 32. Also, during this same one-quarter time period, the switch 34 is closed simultaneously with the switch 42 thus providing a modulated signal 28 to the integrator 30. In the first quarter cycle, the carrier signal 18 is provided with a +1 state while the carrier signal 20 is provided with a 0 state. Thus the first carrier 18 is modulated by the input signal 22. To complete the operation of modulating carrier 18 during the first quarter cycle, switches 38 and 40 are closed to discharge the capacitor before the second quarter cycle begins. With the common capacitance 32 discharged, the second quarter cycle begins with the carrier 20 having a state of +1 and the carrier 18 having a state of 0.

During the second quarter cycle, the switches 38 and 40 are once again activated to discharge the common capacitance 32 with the subsequent operation of switches 36 and 42 to provide the modulated signal 28 to the integrator 30. The operation of the first embodiment of the invention shown in FIG. 2 continues through the third and fourth quarter cycles with the carriers obtaining states of 0 and −1 so that through one complete period of each of the carriers 18 and 20, the input signals 22 and 24 are delivered to a common capacitance 32 in a selective manner to provide modulated signals 28 to the integrator circuit 30.

When the integrator 30 is realized as an inverting amplifier with feedback capacitor, and the switches 36 and 42, or 34 and 42 are in phase, the switched-capacitor network 12 is operated in the inverting mode. Alternatively, when the switches 36 and 40 or 34 and 40 are in phase, the capacitance 32 is being charged by the input signals 22 and 24. When the switches 38 and 42 are operated in phase, the switched capacitor network 12 operates in the noninverting mode. It will be understood from the timing diagram of FIG. 3 that the operation of the switched-capacitor modulator 12 in the non-inverting mode is accomplished during the third and fourth quarter time periods of the carrier signals 18 and 20.

A logic network 16 generates switching signals to effect the operation of the switches 34, 36, 38, 40 and 42 in the switched-capacitor network 14. The logic representation of the switching signals, Sn, where n is the reference number of the respective switch illustrated in FIG. 2, is as follows:

$S34 = S42.L1.L2 + S40.L1.\overline{L2}$
$S36 = S42.\overline{L1}.L2 + S40.\overline{L1}.\overline{L2}$
$S38 = S42.\overline{L2} + S40.L2$ Where L1 and L2 refer to logic levels derived from the clock and carrier signals as shown in FIG. 3. That is, the signals L1 and L2 are square waves at twice the carrier frequency and at the carrier frequency respectively, and are obtained by dividing the frequency of the basic clock signal (S42) by, in this palticular and illustrative case, four and eight respectively, using any of the logic methods well known in the art.

Figure 4:
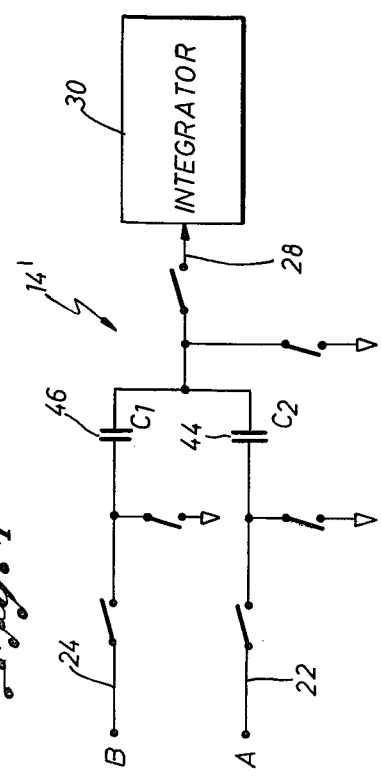
FIG. 4 is an alternative embodiment switched-capacitor modulator for multiple carriers in accordance with the present invention.

In a second embodiment of a switched-capacitor modulator for use in multiple carrier communication systems, two capacitances of equal value may be utilized. Such an embodiment is illustrated in FIG. 4, where multiple input signals 22 and 24 are electrically connected to capacitances 44 and 46, respectively. This alternative switched-capacitor network 14' provides a modulating signal 28 to an integrator 30 in accordance with the state of carrier signals 18 and 20 as illustrated in FIG. 1. In this specific circuit 14', however, the capacitances 44 and 46 must be balanced to avoid system gain problems.

Figure 6:
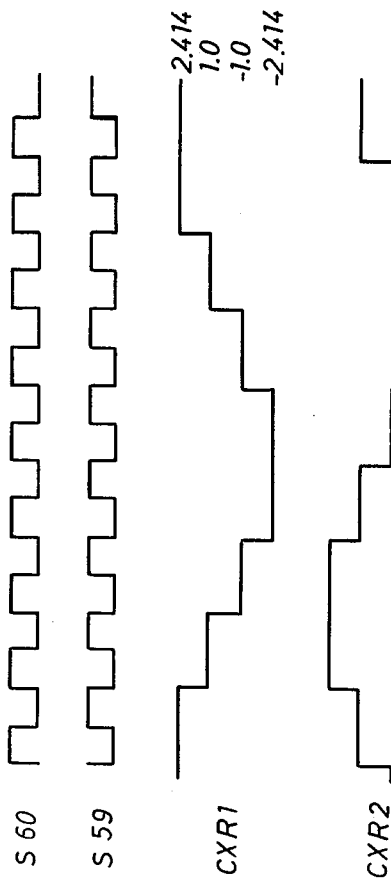
Figure 5:
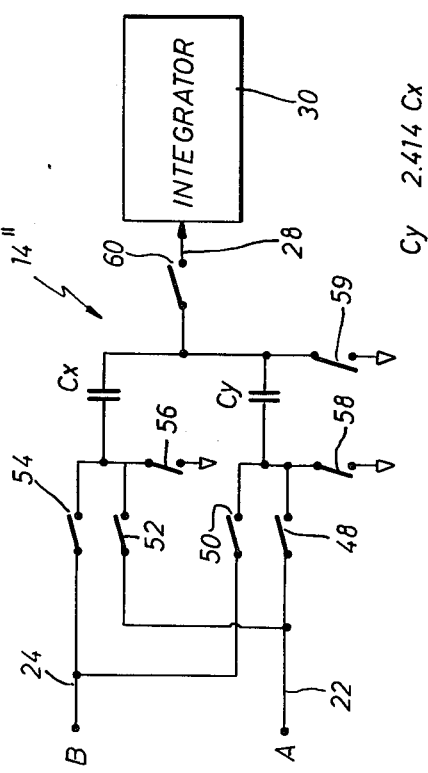
FIG. 5 is a circuit diagram of a switched-capacitor modulator for a shaped carrier in accordance with the present invention; and, FIG. 6 is a timing diagram for a shaped carrier network.

The switched-capacitor modulator system 12 may also be utilized with shaped carrier signals to avoid third and fifth order harmonics in the carrier signals. The shaping of the carrier is accomplished in a switched-capacitor network such as illustrated in FIG. 5. The timing diagrams of FIG. 6 illustrate the operation of the circuit of FIG. 5 with the shaped carriers CXR1 and CXR2. The relationship of $C_x$ to $C_y$ to avoid third and fifth order harmonics is found to be $C_y = 2.414 C_x$.

The logic network 16 as described above for the operation of the circuit of FIG. 2 is also provided with an input clocking signal 26 to operate switches 48, 50, 52, 54, 56, 58, and 60 in the switched-capacitor network 14" shown in FIG. 5. In this embodiment, the input signals 22 and 24 are alternately delivered to capacitors $C_x$ and $C_y$ with the circuit 14" operated in both the inverting and noninverting mode, delivering a modulated signal 28 to an integrator 30. The logical representations of the switching signals, Sn, where n is the reference number of the respective switch illustrated in FIG. 5, are as follows:

$S48 = (S60.L3 + S58.\overline{L3}).L2$
$S50 = (S60.L3 + S58.\overline{L3}).\overline{L2}$
$S52 = (S60.(L1+L3) + S58.\overline{(L1+L3)}).\overline{L2}$
$S54 = (S60.\overline{(L1+L3)} + S58.(L1+L3)).L2$ Where L1, L2 and L3 are logic levels derived from the clock and carrier signals as shown in FIG. 6.

The carrier signals CXR1 and CXR2 have the values of 1, 2.414, and −1, and −2.414. The timing diagram of FIG. 6 demonstrates the operation of the circuit of FIG. 5 when the switches of FIG. 5 are activated in accordance with the state of the carriers. Thus, in one period the input signals 22 and 24 will alternately be delivered to each of the capacitors $C_x$ and $C_y$ in both the inverting and noninverting mode. That is, when the integrator 30 is an operational amplifier (as shown in FIG. 5a) having a feedback capacitor, the activation of the switches of FIG. 5 or 5a in a specific manner will deliver a modulated signal 28 in both an inverted and upright condition. For example, the signal 22 will be delivered to the capacitor $C_y$ in one period of the carrier after the capacitor $C_y$ has been discharged by closing switches 58 and 59. The swithces 48 and 60 are activated to charge the capacitor $C_y$ thus delivering a signal 28. At yet another time in the carrier cycle, the signal 22 will be delivered to the capacitor $C_x$ after $C_x$ has been discharged to ground by closing switches 56 and 59 and subsequently closing switches 52 and 60 to charge the capacitor $C_x$ and deliver a modulated signal 28. Thus the switched capacitor circuit 14" may be operated as both a positive and negative integrator with respect to each of the capacitors $C_x$ and $C_y$ for both input signals 22 and 24. By defining the relationship of the capacitors $C_x$ and $C_y$ to be $C_y = 2.414 \times C_x$ the third and fifth order harmonics in the carriers are suppressed.

While the present invention has been described and illustrated with respect to specific embodiments, it will be understood by those skilled in the art that many modifications are contemplated to be within the scope of the invention as defined in the attached claims. For example, the integrator 30 described above to be an operational amplifier with a feedback capacitor may also be part of the first stage of a more complex switched-capacitor filter, or it may be any other circuit which has as its input mode the inverting input of an operational amplifier (known in the art as a "virtual ground").

What is claimed is:

1. A switched-capacitor modulator for use in a communication system employing amplitude modulation comprising:
   a first and second input signal;
   a switched-capacitor network electrically connected to said first and second input signals including a plurality of input switches, an output switch, a plurality of grounding switches, an output switch, a plurality of grounding switches, and a common capcitor electrically connected between said input and output switches; and,
   a logic circuit adapted to receive first and second carrier signals and a clocking signal, each of said first and second carrier signals having the same frequency but having a ninety-degree phase difference between them, said logic circuit controlling said plurality of input switches so as to modulate each of said carrier signals by one of said first and second input signals by alternately connecting said first and second input signals to said common capacitor, and by changing the phase of said clocking signal under control of the carrier signals to control the closing of said input switches.

2. The switched-capacitor modulator as set forth in claim 1 wherein each of said first and second input signals is connected to one terminal of each of said input switches for purposes of charging the common capacitor when in the closed position, and the other terminal of each of said input switches is connected to a first terminal of one of said grounding switches and also to a first terminal of the common capacitor, and the second terminal of said capacitor is connected to one terminal of the output switch and to a first terminal of another of said grounding switches, and the other terminals of both of said grounding switches are connected to electrical ground.

3. The switched-capacitor modulator as set forth in claim 1 wherein said logic circuit means generates switching signals as a function of the carrier signals to alternately charge and discharge said common capacitor such that said input signals are delivered to said output terminal periodically inverted.

4. The switched-capacitor modulator as set forth in claim 1 further including an integrator circuit adapted to receive said modulated carrier signals for delivering a system modulated signal.

5. The switched-capacitor modulator as set forth in claim 4 further including an operational amplifier with its inverting input connected to said output switch.

6. A switched-capacitor modulator as set forth in either of claims 1 or 5 wherein said common capacitor is a combination of a primary capacitor and a secondary capacitor and said first and second input signals are alternately connected to each of said primary and secondary capacitors.

7. A switched-capacitor modulator for use in a communications system employing quadrature amplitude modulation comprising:
   in phase and quadrature input signals;
   a switched-capacitor network electrically connected to said in phase and quadrature signals including a plurality of input switches, an output switch, a plurality of grounding switches, and a common capacitor electrically connected between said input and output switches;
   a logic circuit adapted to receive first and second carrier signals and a clocking signal, wherein said first and second carrier signals have the same frequency but are out of phase with respect to one another, said logic circuit controlling said plurality of input switches to modulate each of said first and second carrier signals by either of said in phase and quadrature input signals by alternately connecting each of said input signals to said common capacitor, and by changing the phasing of said clocking signal to effect the closing of said input switches under control of said first and second carrier signals.

8. A switched-capacitor modulator for modulating a shaped carrier signal for use in a communications system employing amplitude modulation comprising:
   a first and second input signal source for generating in phase and quadrature signals;
   a switched-capacitor network having a plurality of switches electrically connected to said first and second input signal sources and a primary and a secondary capacitor in electrical parallel relationship with one another such that when one capacitor is transferring a signal from said first input signal source, the other capacitor is transferring a signal from said second input signal source; and,
   a logic circuit adapted to receive a first and second carrier signal and a clocking signal, wherein said carrier signals are at the same frequency but out of phase with respect to one another, said logic circuit operating said plurality of switches to modulate each of said carriers with said first and second input signal sources by sequentially connecting said input signals to each of said primary and secondary capacitors and by changing the phase of said clocking signal to effect the closing of said input switches under control of said first and second carrier signals.

9. A switched-capacitor modulator as set forth in either of claims 7 or 8 further including an integrator for receiving said modulated carrier signals and generating a system modulated signal.

10. A switched-capacitor modulator as set forth in claim 8 and, wherein said primary and secondary capacitors have a relationship of the secondary capacitor being equal to 2.414 times the primary capacitor.

* * * * *